United States Patent
In et al.

(10) Patent No.: US 7,898,250 B2
(45) Date of Patent: Mar. 1, 2011

(54) COUPLED FLUXGATE MAGNETOMETERS FOR DC AND TIME-VARYING TARGET MAGNETIC FIELD DETECTION

(75) Inventors: Visarath In, Chula Vista, CA (US); Adi R. Bulsara, San Diego, CA (US); Yong (Andy) Kho, San Diego, CA (US); Joseph D. Neff, San Diego, CA (US); Antonio Palacios, San Diego, CA (US); Salvatore Baglio, Catania (IT); Vincenzo Sacco, Catania (IT)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 467 days.

(21) Appl. No.: 11/858,966

(22) Filed: Sep. 21, 2007

(65) Prior Publication Data

US 2009/0195245 A1 Aug. 6, 2009

Related U.S. Application Data

(63) Continuation-in-part of application No. 10/874,009, filed on Jun. 18, 2004, now Pat. No. 7,420,366.

(51) Int. Cl.
*G01R 33/04* (2006.01)
(52) U.S. Cl. ........................................ 324/253
(58) Field of Classification Search ............... 324/253
See application file for complete search history.

(56) References Cited

U.S. PATENT DOCUMENTS

| | | | |
|---|---|---|---|
| 3,736,502 A * | 5/1973 | Schonstedt | 324/253 |
| 3,839,683 A * | 10/1974 | Edson | 330/284 |
| 5,642,046 A * | 6/1997 | Hawks | 324/253 |
| 5,789,961 A * | 8/1998 | Bulsara et al. | 327/355 |
| 6,285,249 B1 * | 9/2001 | Bulsara et al. | 327/551 |
| 6,473,362 B1 * | 10/2002 | Gabbay | 367/119 |
| 6,880,400 B1 * | 4/2005 | Fogliatti et al. | 73/504.12 |
| 7,009,392 B2 | 3/2006 | Robinson et al. | |
| 7,420,366 B1 * | 9/2008 | In et al. | 324/253 |
| 7,528,606 B1 * | 5/2009 | In et al. | 324/326 |
| 7,652,472 B2 * | 1/2010 | Kobayashi et al. | 324/253 |
| 2004/0097803 A1 * | 5/2004 | Panescu | 600/424 |

OTHER PUBLICATIONS

Experimental Observation of Multifrequency Patterns in Arrays of Coupled Nonlinear Oscillators, In et al., 4 pages, Physical Review Letters, vol. 91, No. 24, Dec. 12, 2003.*

In et al., Experimental Observation of Multifrequency Patterns in Arrays of Coupled Nonlinear Oscillators, Physical Review Letters, vol. 91, No. 24, published Dec. 11, 2003, 4 pages.*

(Continued)

*Primary Examiner* — Patrick J Assouad
*Assistant Examiner* — David M. Schindler
(74) *Attorney, Agent, or Firm* — Kyle Eppele; J. Eric Anderson (57) ABSTRACT

An apparatus for sensing and processing a magnetic flux signal comprising: an odd number of at least three fluxgate modules, a summer, and a processor. Each fluxgate module is configured to generate a module response signal upon receiving the magnetic flux signal. The fluxgate modules are circularly coupled to each other such that only one-way signal flow is allowed between them. The summer is configured to sum the response signals from each fluxgate module into a summed signal. The processor is configured to receive and process the summed signal.

17 Claims, 8 Drawing Sheets

OTHER PUBLICATIONS

Visarath In, Adi Bulsara, Antonio Palacios, Patrick Longhini, Andy Kho, & Joseph Neff; Coupling-Induced Oscillations in Overdamped Bistable Systems; Physical Review E, 68, 045102(R), 2003.

Adi R. Bulsara, Visarath In, Andy Kho, Patrick Longhini, Antonio Palacios, Wouter-Jan Rappel, Juan Acebron, Salvatore Baglio, & Bruno Ando; Emergent Oscillations in Unidirectionally Coupled Overdamped Bistable Systems; Physical Review E, 70, 036103, 2004.

Visarath In, Adi Bulsara, Antonio Palacios, Patrick Longhini, & Andy Kho; Complex dynamics in unidirectionally coupled overdamped bistable systems subject to a time-periodic external signal; Physical Review E 72, 045104(R), 2005.

Visarath In, Antonio Palacios, Adi Bulsara, Patrick Longhini, Andy Kho, Joseph Neff, Salvatore Baglio, & Bruno Ando; Complex behavior in driven unidirectionally coupled overdamped Duffing elements; Physical Review E 73, 066121, 2006.

Antonio Palacios, Ricardo Carretero-González, Patrick Longhini, Norbert Renz, Visarath In, Andy Kho, Joseph D. Neff, Brian K. Meadows, & Adi R. Bulsara; Multifrequency synthesis using two coupled nonlinear oscillator arrays ; Phys. Rev. E 72, 026211 (2005).

B. Ando, S. Baglio, V. Sacco, A. Bulsara, V. In, A. Kho, A. Palacios, P. Longhini; Dynamic Cooperative Behavior in a Coupled-Core Fluxgate Magnetometer; Proceedings 2006 IEEE International Symposium on Circuits and Systems, May 21-24, 2006.

Visarath In, Andy Kho, Adi .R. Bulsara, Antonio Palacios, Salvatore Baglio, B. Ando, Patrick Longhini, Joseph D. Neff, Brian K. Meadows; Self-Induced Oscillations in Coupled Fluxgate Magnetometer: A Novel Approach to Operating the Magnetic Sensors; IEEE IV-736-739, ISCAS, 2004.

Visarath In, Andy Kho, Adi R. Bulsara, Joseph D. Neff, Salvatore Baglio, Vincenzo Sacco, Antonio Palacios, and Patrick Longhini; Coupling Nonlinear Sensors for Enhanced Sensitivity: A Prototype Using The 3 Coupled-Core Fluxgate Magnetometer; IEEE Sensors 57-60, 2005.

* cited by examiner

COUPLED FLUXGATE MAGNETOMETERS FOR DC AND TIME-VARYING TARGET MAGNETIC FIELD DETECTION

CROSS-REFERENCE TO RELATED APPLICATION

This application is a continuation-in-part of U.S. application Ser. No. 10/874,009, filed 18 Jun. 2004, now U.S. Pat. No. 7,420,366, entitled "Coupled Nonlinear Sensor System" (Navy Case #95759), hereby incorporated by reference for its teachings.

FEDERALLY-SPONSORED RESEARCH AND DEVELOPMENT

This invention (Navy Case No. 97071) is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice (619) 553-2778; email T2 @spawar.navy.mil. Reference Navy Case Number 97071.

BACKGROUND OF THE INVENTION

Fluxgate magnetometers detect localized changes to the earth's magnetic field caused by the presence of ferrous objects. There are problems associated with current fluxgate magnetometers. For example, although current fluxgate magnetometers will detect the presence of a ferrous object, they lack a means for enhancing resolution of the detected signal that is due to the presence of the ferrous object. Another problem is the inability of current fluxgate magnetometers to produce oscillations (necessary for magnetic signal detection) with reduced power consumption. A further problem not addressed by current fluxgate magnetometers is the lack of a single device to suitably detect both time-invariant (i.e., DC) and time-varying (i.e., AC) target signals. A need exists for a fluxgate magnetometer capable of detecting both DC and AC target signals with enhanced resolution and lower power consumption.

BRIEF DESCRIPTION OF THE DRAWINGS

Throughout the several views, like elements are referenced using like references.

DETAILED DESCRIPTION OF EMBODIMENTS

Glossary of Terms

AC Time-Varying
DC Time-Invariant
MEM Micro-electro-mechanical
PCB Printed Circuit Board
PIC Programmable Integrated Circuit
RT− Lower residence time
RT+ Upper residence time
TTL Transistor-Transistor Logic
V-I Voltage to Current Some nonlinear, non-oscillatory dynamic systems can be made to oscillate through careful coupling of system components. The frequency and other dynamical characteristics of the induced oscillations depend on the system and target signal parameters. Here, a sensor 10, comprising coupled nonlinear fluxgate magnetometers may be configured to detect and/or quantify weak time-invariant (DC) or time-varying (AC) magnetic flux signals.

Figure 1:
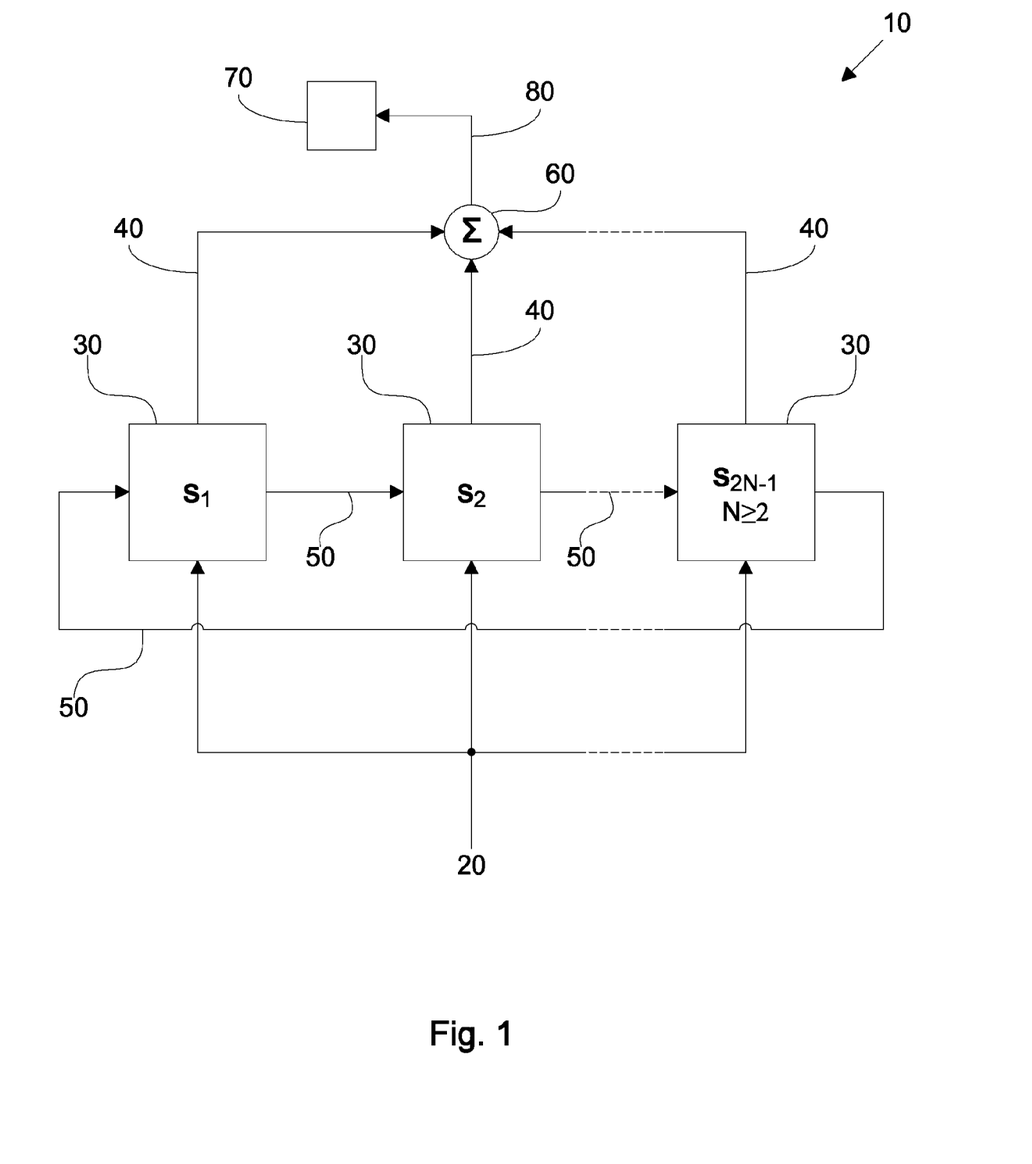
FIG. 1 shows a block diagram of a sensor for sensing a magnetic flux signal.

FIG. 1 shows a block diagram of the sensor 10 for sensing a magnetic flux signal 20. Sensor 10 comprises an odd number of at least three fluxgate modules 30, shown in FIG. 1 as $s_1$, $s_2$, and $s_{2N-1}$, where N is an integer greater than or equal to 2. Each fluxgate module 30 is configured to generate a module response signal 40 upon receiving the magnetic flux signal 20. Each of the fluxgate modules 30 is circularly coupled to each other such that a current signal 50 only flows in one direction between the coupled fluxgate modules 30. Sensor 10 also comprises a summer 60 and a processor 70. The summer 60 is configured to sum the module response signals 40 from each fluxgate module 30 into a summed signal 80. The processor 70 is configured to receive and process the summed signal 80. The processor 70 may be any processor capable of processing, analyzing, and/or storing the summed signal 80. An example of the processor 70 is a programmable integrated circuit (PIC) microcontroller. The summer 60 may be any summing circuit capable of summing the module response signals 40 from each fluxgate module 30.

Figure 2:
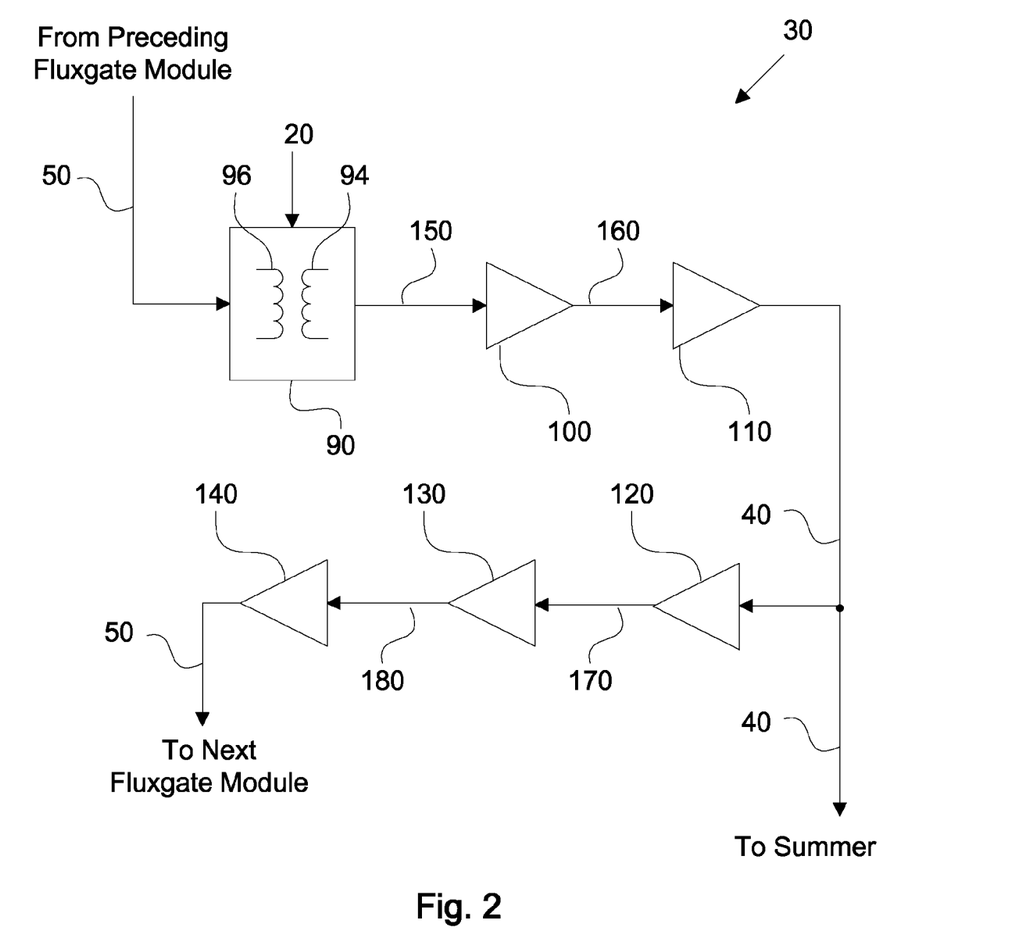
FIG. 2 shows a block diagram of a fluxgate module.

FIG. 2 shows a block diagram of a fluxgate module 30. Each fluxgate module 30 comprises: a fluxgate sensor 90 with a sensing coil 94 and a driving coil 96, a primary amplifier 100, a primary "leaky" integrator 110, a secondary "leaky" integrator 120, a secondary amplifier 130, and a voltage to current (V-I) converter 140. The sensing coil 94 is configured to produce a derivative signal 150, which is the derivative signal of the flux detected by the sensing coil 94. The voltage of the derivative signal 150 may then be amplified by the primary amplifier 100 to produce an amplified derivative signal 160. In one embodiment, the primary amplifier 100 may be an instrumentation amplifier with very high impedance. Both the primary and secondary amplifiers 100 and 130 may be high precision operational amplifiers. The primary amplifier 100 may also trim out any dc in the derivative signal 150. The primary "leaky" integrator 110 is configured to transform the amplified derivative signal 160 into the module response signal 40. The primary "leaky" integrator 110 may also prevent divergence caused by dc signals in the amplified derivative signal 160. The secondary "leaky" integrator 120 is configured to transform the module response signal 40 into a filtered signal 170. The secondary "leaky" integrator 120 may filter out remaining dc signals in the module response signal 40. The operating parameters of both the primary and secondary "leaky" integrators 110 and 120 may be tuned to desired low frequency roll-off characteristics. The secondary amplifier 130 is configured to amplify the voltage of the filtered signal 170 to produce an amplified filtered signal 180. The V-I converter 140 is configured to convert the amplified filtered signal 180 into the current signal 50 that may be conducted to the driving coil 96 of the next-in-line fluxgate module 30. The gain of the V-I converter 140 may be set at much less than unity so that one volt in the amplified filtered signal 180 does not convert to one ampere in the current signal 50. The driving coil 96 of the first fluxgate module 30, or $s_1$, is configured to receive the current signal 50 from the last fluxgate module 30, or $s_{2N-1}$, such that all the fluxgate modules 30 are circularly coupled as shown in FIG. 1. All the values of the coupling circuit parameters may be closely matched from one fluxgate module 30 to the other.

The onset of internal oscillations in the fluxgate modules 30 in the presence of magnetic flux signals 20 may be controlled by tuning the gain in the coupling circuitry, as described above. High gain produces high frequency oscillations and low gain produces low frequency oscillations. When the gain is lower than a critical value, the oscillations cease to exist. The sensitivity of the coupled fluxgate modules 30 to magnetic flux signals 20 is directly related to the gain value. The closer the gain value is to the critical value, the higher the sensitivity. Sensor 10 may be tuned for different applications with different sensitivity requirements by adjusting the gain in the coupled fluxgate modules 30. For example, tuning the gain in the fluxgate modules 30 to be to be slightly more positive than a critical threshold value effectively configures the fluxgate modules 30 to collectively oscillate at the same frequency as the magnetic flux signal 20. On the other hand, tuning the gain in the fluxgate modules 30 to be slightly more negative than a critical threshold value effectively configures the fluxgate modules 30 to collectively oscillate such that the amplitude of the collective oscillations is modulated by the magnetic flux signal.

Figure 3:
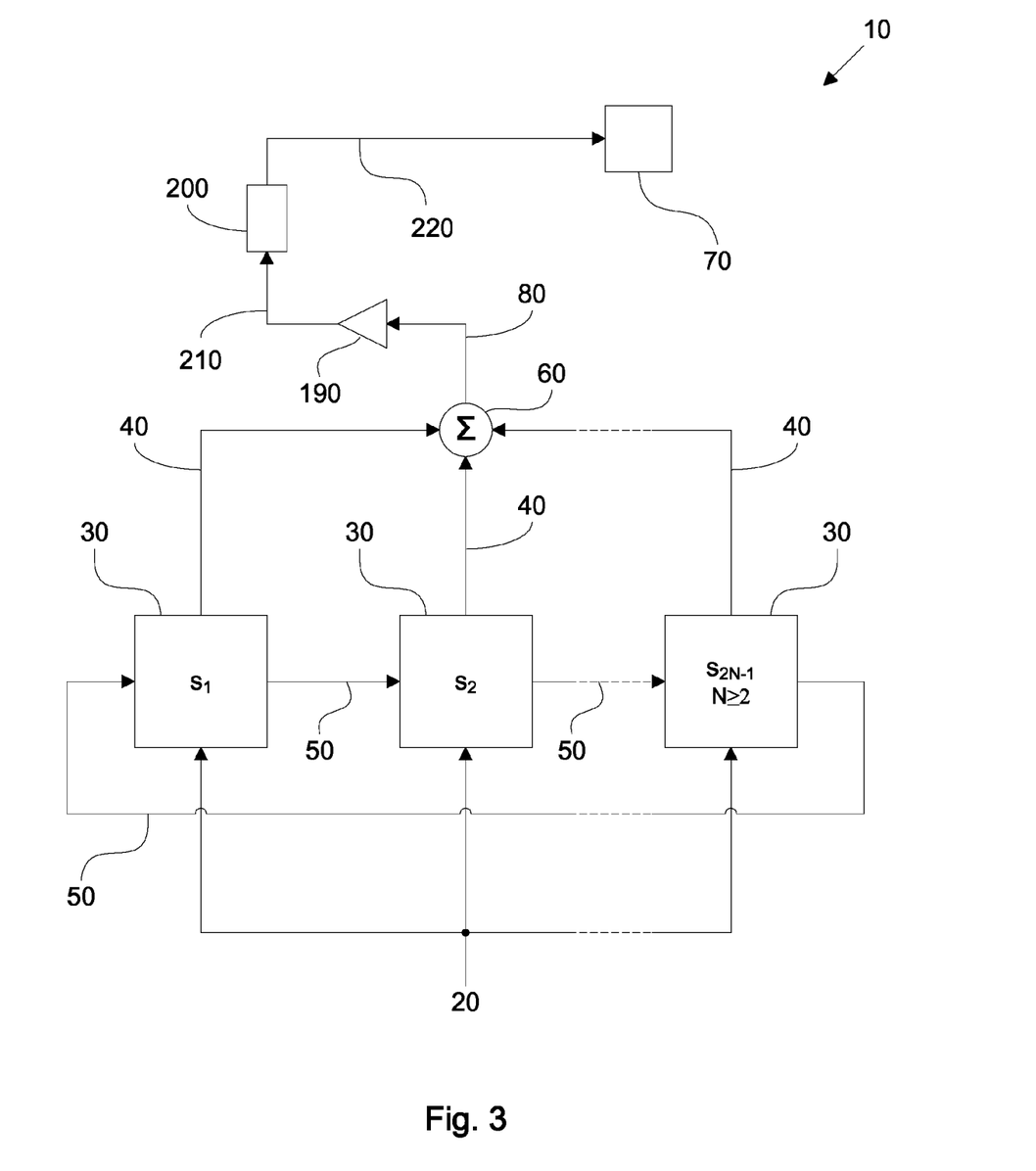
FIG. 3 shows a block diagram of another embodiment of a sensor for sensing a magnetic flux signal.

FIG. 3 shows an embodiment of sensor 10 further comprising: a Schmitt trigger 190, and a conversion circuit 200. The Schmitt trigger 190 may be interposed between the processor 70 and the summer 60 and is disposed to transform the summed signal 80 into a trigger output 210. The conversion circuit 200 is configured to convert the trigger output 220 into a transistor-transistor logic (TTL) signal 220. The conversion circuit 200 may be interposed and electrically coupled between the Schmitt trigger 190 and the processor 70. In one embodiment, the conversion circuit 200 may comprise a voltage divider and a diode such that the trigger output signal 210 passes first through the voltage divider and then through the diode on its way to the processor 70. In practice, the processor 70 is configured to analyze the TTL signal 220. The processor 70 may be configured to determine whether the TTL signal 220 is HIGH or LOW, as explained below. If the summed signal 80 is greater than the upper threshold value of the Schmitt trigger 190, then the trigger output 210 is a HIGH corresponding to about +10V. The trigger output 210 remains HIGH until the summed signal 80 falls below the lower threshold value of the Schmitt Trigger 190. When the summed signal 80 falls below the lower threshold value of the Schmitt Trigger 190, the trigger output signal 210 is a LOW corresponding to about -10V. The trigger output 210 may then pass through the conversion circuit 200 in which +5V corresponds to a HIGH and 0V corresponds to a LOW.

In practice, this HIGH and LOW state may then be passed to the processor 70 for further processing. For example, when sensor 10 is turned on, the processor 70 may look for a LOW state. Once a LOW state is recognized, the processor 70 may retrieve the clock time and mark that time as the previous lower threshold crossing time. Then, the processor 70 may wait for a HIGH state. Once a HIGH state is recognized, the processor 70 may retrieve the clock time and mark that time as the previous upper threshold crossing time. Then the processor 70 waits for the next LOW state, which when reached, the processor again retrieves the clock time and marks that time as the lower threshold crossing time. Finally, the lower threshold crossing time becomes the previous lower threshold crossing time, and processor 70 repeats the process. Upper and lower residence times, RT+ and RT− respectively, may be determined as follows: RT− is the time difference between the crossing time of the upper threshold and the crossing time of the previous lower threshold; RT+ is the time difference between the crossing time of the lower residence time and the upper residence time. RT− and RT+ may be accumulated by the processor 70 for ten to fifteen oscillation cycles of the sensor 10. A mean and a standard deviation may then be computed for both RT+ and RT−. If the magnetic flux signal 20 is zero, then the mean values of RT+ and RT− are the same (within the first standard deviation). If the magnetic flux signal 20 is nonzero, then RT+ is different from RT−. The difference between RT+ and RT− is proportional to the external magnetic field. Because there is inherent noise within the sensor 10, the standard deviation is always nonzero for both RT+ and RT−. The resolution of the sensor 10 (i.e. its ability to detect the smallest field change) is at least one standard deviation of the residence times.

Figure 4:
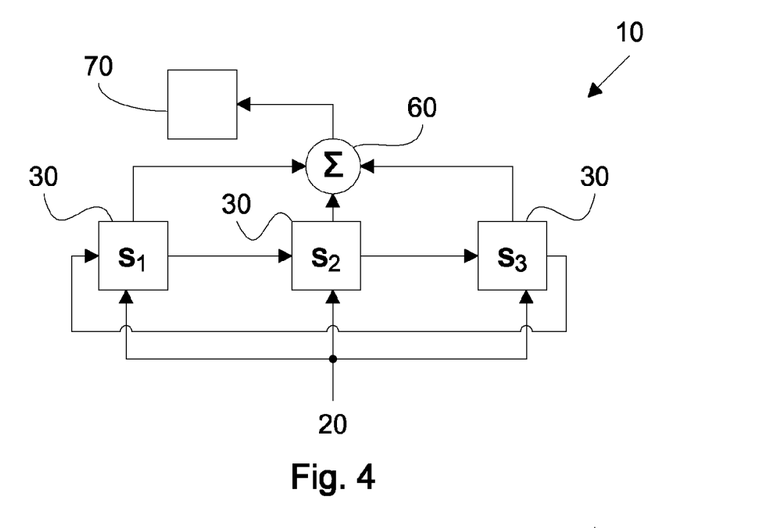
FIG. 4 shows a 3-module embodiment of the sensor.
Figure 5:
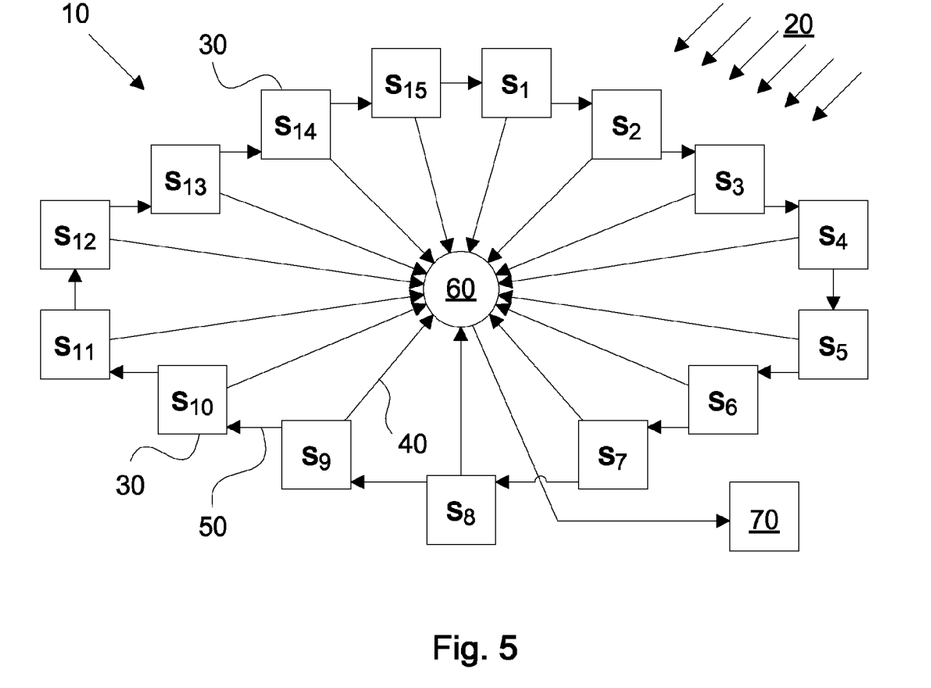
FIG. 5 shows a 15-module embodiment of the sensor.

FIGS. 4 and 5 show different embodiments of sensor 10 for detecting magnetic flux signal 20. FIG. 4 shows an embodiment of sensor 10 comprising only three fluxgate modules 30, $s_1$-$s_3$. FIG. 5 shows an embodiment of sensor 10 comprising fifteen fluxgate modules 30, $s_1$-$s_{15}$. In FIG. 5, only two out of the fifteen fluxgate modules 30 have been identified by reference numbers for the sake of clarity. Likewise, for the sake of clarity, the current signal 50 and the module response signal 40 have not been identified in FIG. 5 in every incident.

Figure 6:
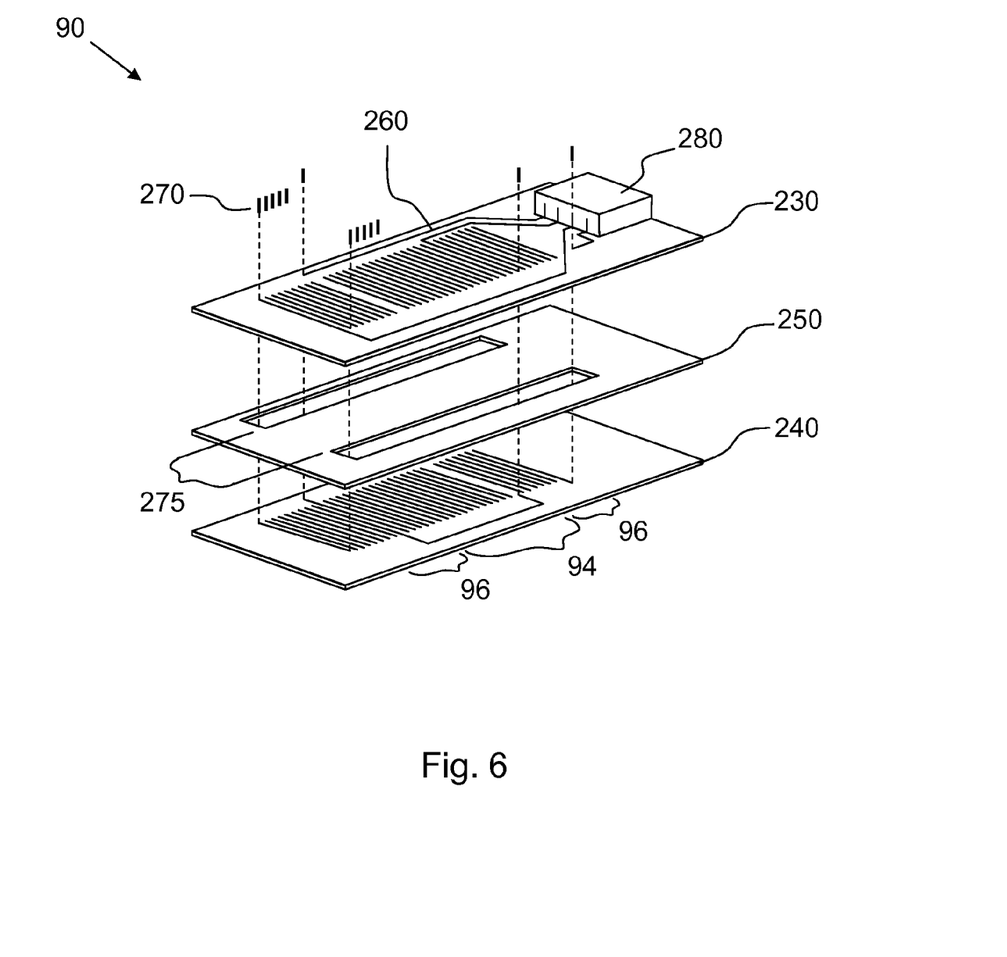
FIG. 6 shows an exploded view of an embodiment of a fluxgate sensor.
Figure 7:
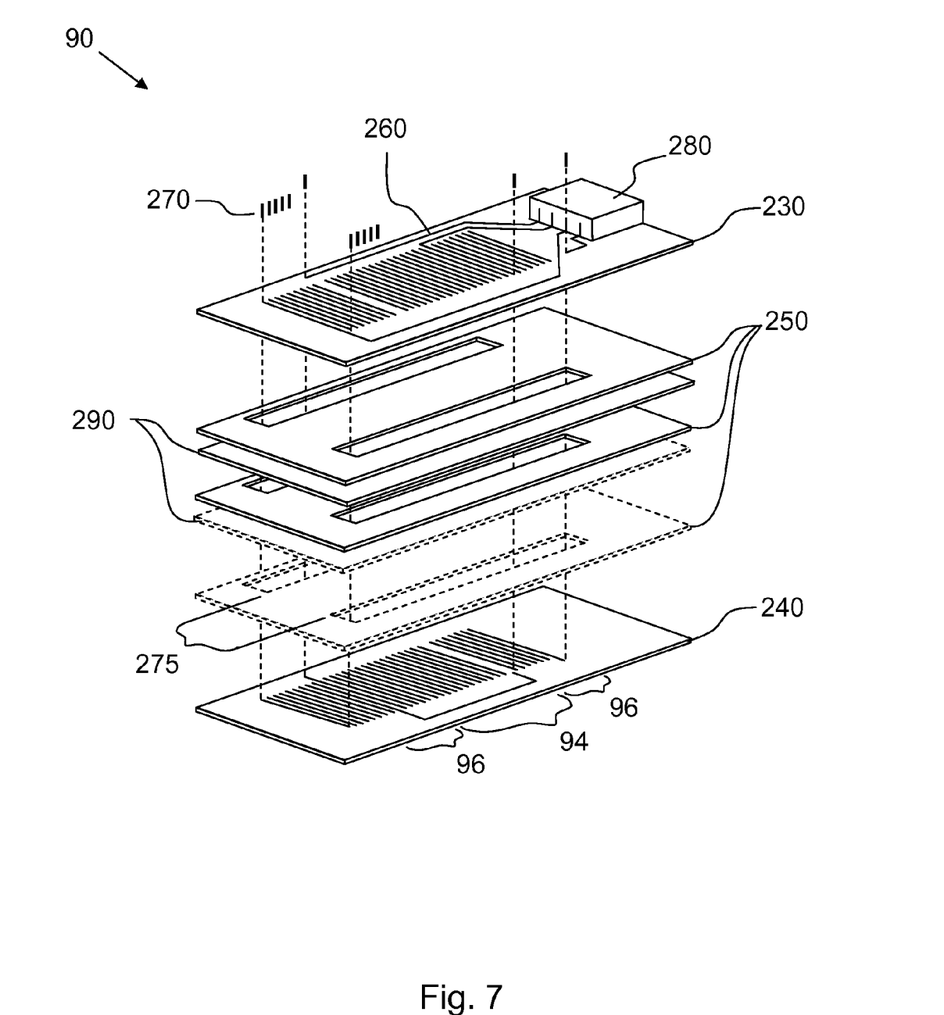
FIG. 7 shows an exploded view of a multi-core embodiment of a fluxgate sensor.

FIG. 6 shows an exploded view of an embodiment of the fluxgate sensor 90. In the embodiment shown, the fluxgate sensor 90 comprises upper, lower, and middle layers 230, 240, and 250 respectively. The upper layer 230 and the lower layer 240 may be made of printed circuit board (PCB) material. The middle layer 250 may be made of ferromagnetic material with a high permeability constant. For example, the middle layer 250 may be made of Cobalt-based Metglas® 2714A (Metglas® is a registered trademark of Metglas, Inc.). Electrical traces 260 may be placed on the upper and lower layers 230 and 240 to form the sensing coil 94 and the driving coil 96. As shown in FIG. 7, the electrical traces 260 on the upper layer 230 may be connected to the electrical traces 260 on the lower layer 240 by connectors 270, which pass through the middle layer 250. Once connected, the electrical traces 260 form the sensing coil 94 and the driving coil 96, with a section of the middle layer 250 functioning as a ferromagnetic core 275 for the fluxgate sensor 90. In this embodiment, the connectors 270 may be, but are not limited to, copper wire soldered to the electrical traces 260 on the upper and lower layers 230 and 240. An interface 280 is also shown in FIG. 6. The interface 280 is electrically coupled to the electrical traces 260 for the sensing coil 94 and the driving coil 96. In one embodiment, the interface 280 may be a standard 4-pin connector. The interface 280 is configured to couple the corresponding driving coil 96 to the current signal 50 from the preceding fluxgate module 30. The interface 280 is also configured to facilitate transmission of the derivative signal 150 from the corresponding sensing coil 94 to the primary amplifier 100. In another embodiment of the fluxgate sensor 90, the ferromagnetic core 275 may be annealed.

FIG. 7 shows an exploded view of another embodiment of the fluxgate sensors 90 comprising multiple middle layers 250. Each middle layer 250 is electrically insulated from one another by insulators 290 to prevent Eddy currents from passing from one core to the other. The shape of the ferromagnetic core 275 is not limited to the shape shown in FIGS. 6 and 7, but may be any shape around which the sensing coil 94 and the driving coil 96 may be formed. For example, the core 275 may be cylindrical. The fluxgate sensor 90 may comprise a tube with the sensing coil 94 and the driving coil 96 wrapped around the tube. The fluxgate sensor 90 may be constructed as a micro-electro-mechanical (MEM) device.

Figure 8:
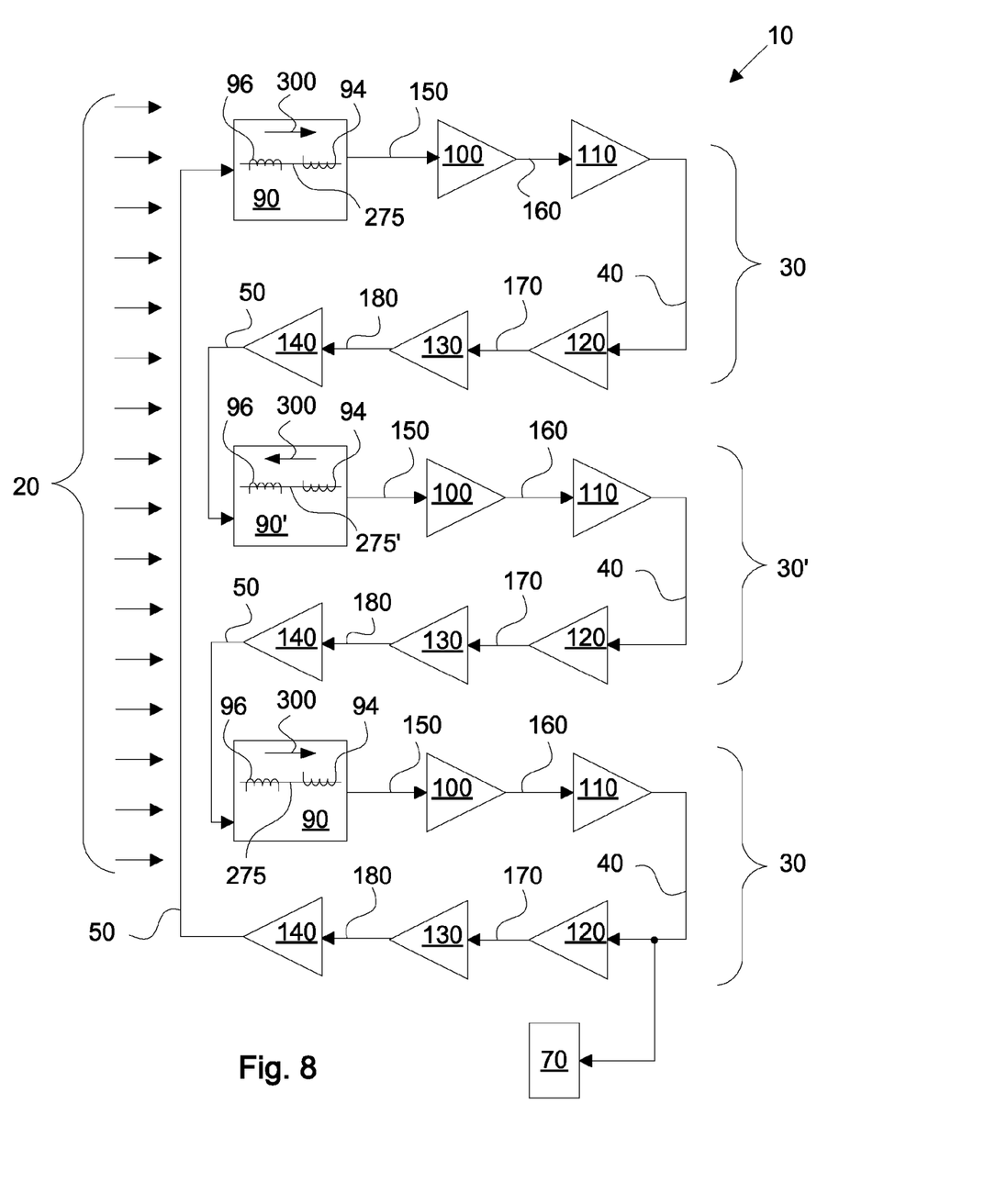
FIG. 8 shows an embodiment of the sensor for sensing a magnetic flux signal with one fluxgate sensor being in an opposite magnetic orientation than the other fluxgate sensors.

FIG. 8 shows another embodiment of sensor 10 wherein the magnetic orientation 300 of the ferromagnetic core 275' of one fluxgate sensor 90' out of three fluxgate modules 30 is oriented in an opposite manner to the direction for the magnetic flux signal 20. The magnetic orientations 300 of the other two ferromagnetic cores 275 of the other fluxgate modules 30, shown in FIG. 8, are opposite to the ferromagnetic core 275 of fluxgate sensor 90'. In this embodiment, the processor 70 receives a module response signal 40 coming from the fluxgate module 30 that follows the fluxgate module 30'.

Figure 9:
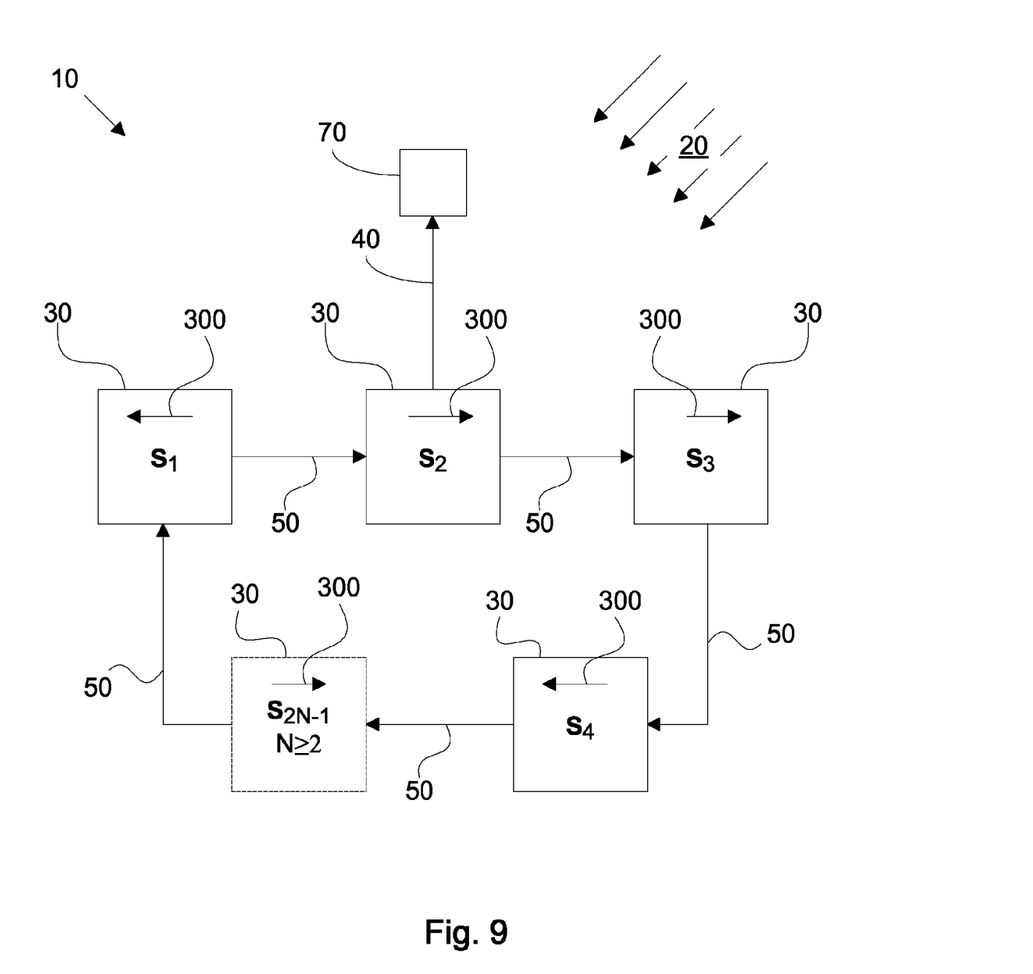
FIG. 9 shows an embodiment of the sensor for sensing a magnetic flux signal where the magnetic orientation of the fluxgate modules alternates between fluxgate modules.

FIG. 9 shows another embodiment of the sensor 10 for sensing a magnetic flux signal 20. In this embodiment, sensor 10 comprises an odd number of at least three fluxgate modules 30, shown in FIG. 9 as $s_1$, $s_2$, $s_3$, $s_4$, and $s_{2N-1}$, where N is an integer greater than or equal to 2. The module response signal 40 from one of the fluxgate modules 30 may be processed by the processor 70. In the embodiment shown in FIG. 9, the module response signal 40 from $s_2$ is directed to the processor 70 and, following $s_3$, the magnetic orientation 300 of each fluxgate module 30 alternates until $s_{2N-1}$ is connected back to $s_1$.

From the above description of the sensor 10 for sensing a magnetic flux signal 20, it is manifest that various techniques may be used for implementing the concepts of sensor 10 without departing from its scope. The described embodiments are to be considered in all respects as illustrative and not restrictive. It should also be understood that sensor 10 is not limited to the particular embodiments described herein, but is capable of many embodiments without departing from the scope of the claims.

We claim:

1. An apparatus for sensing and processing a magnetic flux signal comprising:
    an odd number of at least three fluxgate modules $S_1$ through $S_{2N-1}$, where N is an integer greater than or equal to 2, each configured to generate a module response signal upon receiving the magnetic flux signal, wherein each of the fluxgate modules is circularly coupled to each other such that only one-way signal flow is allowed between the fluxgate modules;
    a summer configured to sum the response signals from the fluxgate modules into a summed signal;
    a processor configured to receive and process the summed signal; and
    wherein each of the fluxgate modules comprises:
        a fluxgate sensor comprising a sensing coil, a driving coil, and a ferromagnetic core, wherein the sensing coil produces a coil response signal;
        a primary amplifier configured to amplify a voltage of the coil response signal;
        a primary "leaky" integrator configured to transform the amplified coil response signal into the module response signal;
        a secondary "leaky" integrator configured to transform the module response signal into a filtered signal;
        a secondary amplifier configured to convert the filtered signal into an amplified, filtered signal; and
        a voltage to current (V-I) converter configured to convert the amplified, filtered signal into a current signal, wherein the current signal of each fluxgate module is conducted to the driving coil of a next-in-line fluxgate module of the at least three fluxgate modules and the driving coil of the fluxgate module $S_1$ is configured to receive the current signal from the fluxgate module $S_{2N-1}$ such that all the fluxgate modules are circularly coupled.

2. The apparatus of claim 1, further comprising:
    a Schmitt trigger interposed between the processor and the summer;
    a voltage divider interposed between the Schmitt trigger and the processor; and
    a diode interposed between the voltage divider and the processor.

3. The apparatus of claim 1, further comprising:
    an upper printed circuit board (PCB) with one half of the driving and sensing coils is printed thereon;
    a lower PCB with the other half of the driving and sensing coils is printed thereon; and
    a middle ferromagnetic layer interposed between the upper and lower PCBs, such that the middle ferromagnetic layer forms a core inside both the driving and sensing coils.

4. The apparatus of claim 3, wherein the ferromagnetic layer is annealed.

5. The apparatus of claim 3, wherein the middle ferromagnetic layer comprises multiple ferromagnetic layers electrically insulated from each other.

6. The apparatus of claim 1, wherein a coupling parameter of the fluxgate modules is tuned to be slightly more positive than a critical threshold value, wherein the fluxgate modules are configured to collectively oscillate at a same frequency as the magnetic flux signal.

7. The apparatus of claim 1, wherein a coupling parameter of the fluxgate modules is tuned to be slightly more negative than a critical threshold value such that the fluxgate modules are configured to collectively oscillate and that the amplitude of the collective oscillations is modulated by the magnetic flux signal.

8. The apparatus of claim 7, wherein operating parameters of the primary and secondary "leaky" integrators are tuned to desired low frequency roll-off characteristics.

9. The apparatus of claim 8, wherein in each fluxgate module the gain of the V-I converter is configured to be much less than unity such that one volt in the amplified, filtered signal does not convert to one ampere in the current signal.

10. The apparatus of claim 9, wherein in each fluxgate module the fluxgate sensor further comprises a tube, wherein the sensing and driving coils are wrapped around the tube.

11. The apparatus of claim 10, wherein each fluxgate sensor further comprises an annealed core within the tube.

12. An apparatus for sensing and processing a magnetic flux signal comprising:
    an odd number of at least three fluxgate modules, each configured to generate a module response signal upon receiving the magnetic flux signal, wherein each of the fluxgate modules is circularly coupled to each other such that only one-way signal flow is allowed between the fluxgate modules;
    a summer configured to sum the response signals from the fluxgate modules into a summed signal;
    a processor configured to receive and process the summed signal;

a Schmitt trigger interposed between the processor and the summer;

a voltage divider interposed between the Schmitt trigger and the processor; and a diode interposed between the voltage divider and the processor.

13. An apparatus for sensing a magnetic flux target signal comprising:

first, second, and third fluxgate modules, each configured to generate a module response signal upon receiving the target signal, wherein each of the fluxgate modules is circularly coupled to each other such that only one-way signal flow is allowed between the fluxgate modules;

a summer configured to sum the response signals from the fluxgate modules into a summed signal;

a processor configured to receive the summed signal; and wherein each of the fluxgate modules comprises:

a fluxgate sensor comprising a sensing coil and a driving coil, wherein the sensing coil produces a coil response signal;

a primary amplifier configured to amplify a voltage of the coil response signal;

a primary "leaky" integrator configured to transform the amplified coil response signal into the module response signal;

a secondary "leaky" integrator configured to transform the module response signal into a filtered signal;

a secondary amplifier configured to amplify the voltage of the filtered signal; and a voltage to current (V-I) converter configured to convert the amplified, filtered signal into a current signal, wherein the current signal of the first fluxgate module is conducted to the driving coil of the second fluxgate module, the current signal of the second fluxgate module is conducted to the driving coil of the third fluxgate module, and the current signal of the third fluxgate module is conducted to the driving coil of the first fluxgate module.

14. The apparatus of claim 13, wherein each fluxgate module has a magnetic orientation and wherein the magnetic orientation of one of the fluxgate modules is opposite the magnetic orientation of the other two fluxgate modules.

15. The apparatus of claim 13, wherein a coupling parameter of the fluxgate modules is tuned to exceed a critical threshold value thereby causing the fluxgate modules to oscillate.

16. The apparatus of claim 13, wherein a coupling parameter of the fluxgate modules is tuned to be slightly more positive than a critical threshold value, wherein the fluxgate modules are configured to collectively oscillate at a same frequency as the target signal.

17. The apparatus of claim 13, wherein a coupling parameter of the fluxgate modules is tuned to be slightly more negative than a critical threshold value such that the fluxgate modules are configured to collectively oscillate and that the amplitude of the collective oscillations is modulated by the target signal.

* * * * *